(12) United States Patent
Bao

(10) Patent No.: US 12,113,496 B2
(45) Date of Patent: Oct. 8, 2024

(54) POWER AMPLIFIER WITH LARGE OUTPUT POWER

(71) Applicant: Telefonaktiebolaget LM Ericsson (publ), Stockholm (SE)

(72) Inventor: Mingquan Bao, Västra Frölunda (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 497 days.

(21) Appl. No.: 17/621,781

(22) PCT Filed: Jun. 24, 2019

(86) PCT No.: PCT/SE2019/050604
§ 371 (c)(1),
(2) Date: Dec. 22, 2021

(87) PCT Pub. No.: WO2020/263134
PCT Pub. Date: Dec. 30, 2020

(65) Prior Publication Data
US 2022/0368298 A1    Nov. 17, 2022

(51) Int. Cl.
*H03F 1/18*    (2006.01)
*H03F 1/56*    (2006.01)
(Continued)

(52) U.S. Cl.
CPC .............. *H03F 3/607* (2013.01); *H03F 1/18* (2013.01); *H03F 1/565* (2013.01); *H03F 3/245* (2013.01); *H03F 2200/423* (2013.01)

(58) Field of Classification Search
CPC .................. H03F 1/18; H03F 1/02; H03F 1/07
(Continued)

(56) References Cited

U.S. PATENT DOCUMENTS

| | | |
|---|---|---|
| 3,210,682 A | 10/1965 | Sosin |
| 5,012,203 A | 4/1991 | Beyer et al. |

(Continued)

FOREIGN PATENT DOCUMENTS

| | | |
|---|---|---|
| EP | 0401632 A2 | 12/1990 |
| EP | 3116122 A2 | 11/2017 |
| EP | 3340463 A1 | 6/2018 |

OTHER PUBLICATIONS

Extended European Search report dated Jun. 2, 2022 for Application No. 19935336.8, consisting of 12 pages.

(Continued)

*Primary Examiner* — Henry Choe
(74) *Attorney, Agent, or Firm* — Weisberg I.P. Law, P.A.

(57) ABSTRACT

A power amplifier has a number n of power cells $A_i$, a number n of output transmission lines $TL_{1i}$ for combining output powers from the power cells, and a number n of impedance transformation network $ITN_i$, where i=1, ... n. The number n of output transmission lines are connected in series. The output terminal of each power cells is connected to its output transmission line via its impedance transformation network. Each impedance transformation network is an upward impedance transformation network for transforming an output impedance of each power cell at the input terminal of the impedance transformation network into a higher impedance at the output terminal of the impedance transformation network. A number n of input transmission lines $TL_{0i}$ (i=1, 2 ... n)=connected in series. The input terminal of the i-th power cell is connected to the second terminal of the i-th transmission line via a capacitor, where i=1, ... n.

20 Claims, 9 Drawing Sheets

700

(51) Int. Cl.
*H03F 3/24* (2006.01)
*H03F 3/60* (2006.01)

(58) Field of Classification Search
USPC .................................... 330/286, 295, 124 R
See application file for complete search history.

(56) References Cited

U.S. PATENT DOCUMENTS

| | | | | |
|---|---|---|---|---|
| 7,724,091 | B2* | 5/2010 | Vickes | H03F 3/602 |
| | | | | 330/54 |
| 8,035,449 | B1 | 10/2011 | Kobayashi | |
| 8,665,022 | B2* | 3/2014 | Kobayashi | H03F 3/607 |
| | | | | 330/266 |
| 2004/0070455 | A1* | 4/2004 | Hong | H03F 3/607 |
| | | | | 330/286 |
| 2012/0274406 | A1* | 11/2012 | Kobayashi | H03F 1/223 |
| | | | | 330/310 |
| 2014/0266460 | A1 | 9/2014 | Nobbe et al. | |

OTHER PUBLICATIONS

Ross et al. "Taper and Forward-Feed in GaAs MMIC Distributed Amplifiers"; Northern Telecom Ltd.; LL-1; 1989 IEEE MTT-S Digest, consisting of 4 pages.
Tapped Capacitor Matching; IntgCkts; A RFIC designer's notes; Nov. 28, 2018, consisting of 3 pages.
Tapped Inductor Matching; IntgCkts; A RFIC designer's notes; Dec. 19, 2018, consisting of 2 pages.
International Search Report and Written Opinion dated Mar. 5, 2020 for International Application No. PCT/SE2019/050604 filed Jun. 24, 2019, consisting of 12-pages.
Bipul Agarwal et al.; 112-GHz, 157-GHzz and 180-GHz InP HEMT Traveling-Wave Amplifiers; IEEE Transactions on Microwave Theory and Techniques, vol. 46, No. 12; IEEE; Dec. 1998, consisting of 7-pages.
Paul Saad et al.; A 1.8-3.8-GHzz Power Amplifier with 40% Efficiency at 8-dB Power Back-Off; IEEE Transactions on Microwave Theory and Techniques, vol. 66, No. 11; IEEE; Nov. 2018, consisting of 13-pages.
Erik Ojefors et al.; An 8-Way Power-Combining E-band Amplifier in a SiGe HBT Technology; 2014 9th European Microwave Integrated Circuits Conference; IEEE; Oct. 2014, consisting of 4-pages.
Ernest J. Wilkinson; An N-Way Hybrid Power Divider; IRE Transactions on Microwave Theory and Techniques, vol. 8, No. 1; Jan. 1960, consisting of 3-pages.
Neeta P. Mehta et al.; Design Guidelines for a Novel Bandpass Distributed Amplifier; 2005 European Microwave Conference; IEEE; 2005, consisting of 4-pages.
Charles F. Campbell; Evolution of the Nonuniform Distributed Power Amplifier; IEEE Microwave Magazine, vol. 20, No. 1; IEEE; Jan. 2019, consisting of 10-pages.
Hooman Rashtian et al.; Gain Boosting in Distributed Amplifiers for Close-to-fmax Operation in Silicon; IEEE Transactions on Microwave Theory and Techniques, vol. 67, No. 3; IEEE; Mar. 2019, consisting of 11-pages.
Huei Wang et al.; MM-Wave Integration and Combinations; IEEE Microwave Magazine, vol. 13, No. 5; IEEE; Jul.-Aug. 2012, consisting of 9-pages.
Gholamreza Nikandish et al.; The (R)evolution of Distributed Amplifiers; IEEE Microwave Magazine, vol. 19, No. 4; IEEE; Jun. 2018, consisting of 18-pages.

* cited by examiner

POWER AMPLIFIER WITH LARGE OUTPUT POWER

CROSS-REFERENCE TO RELATED APPLICATIONS

This application is a Submission Under 35 U.S.C. § 371 for U.S. National Stage Patent Application of International Application Number: PCT/SE2019/050604, filed Jun. 24, 2019 entitled "POWER AMPLIFIER WITH LARGE OUTPUT POWER," the entirety of which is incorporated herein by reference.

TECHNICAL FIELD

Embodiments herein relate to a power amplifier. In particular, they relate to a power amplifier with large output power, an electronic device and a transmitter comprising the power amplifier.

BACKGROUND

Power amplifiers (PA) are widely used for example in radio base stations and user equipments in wireless communication systems, as well as in radar systems. A power amplifier in a transmitter typically amplifies an input signal into an output signal ready for radio transmission. In a micro or millimeter wave transmitter, a PA needs to deliver a large output power for long-distance communication or radar-detection. One approach to boost the output power is combining output powers from several power cells, i.e., transistors, on-chip. The power combiner must add output powers from the power cells constructively, i.e. in-phase, and provide impedance matching for each power cell, as well as outside load impedance.

A 2-way Wilkinson power combiners is widely used, which consists of two quarter wavelength ($\lambda_g/4$) transmission lines and one resistor, as shown in FIG. 1. A 4-way power combiner can be comprised of three Wilkinson power combiners. To minimize the combiner's footprint, as well as the loss, short micro strip transmission lines (e.g. $\lambda_g/36$) may be used, and the resistor in a Wilkinson power combiner is skipped, such as an 8-way power combiner disclosed in E. Ojefors, et. al., "*An 8-Way Power-Combining E-band Amplifier in a SiGe HBT technology*", Proceedings of the 9th European Microwave Integrated Circuits Conference, pp. 45-48, 2014. Such a power combiner presents high impedance (e.g. >50Ω) for each power cell.

Transformers are often used for combining power as shown in FIG. 2.

Transformers may be configured to combine the powers in series, as shown in FIG. 2(*a*), or in parallel as shown FIG. 2(*b*). It is also possible to mix a series- and a parallel-combining as shown in FIG. 2(*c*).

For the series-combing transformers, the power combiner provides an impedance of $R_{load}/N$ approximately for each power cell, where, $R_{load}$ is the impedance of the output port, and N is the number of power cells. While, for the parallel-combining transformers, the corresponding impedance for each power cell is $N*R_{load}$.

It should be pointed out, for the sick of large output power, the series-combining transformers is superior to the parallel-combining one, because lower impedance for power cells or transistors is desired. Assuming $R_{opt}$ is the required intrinsic load for the transistor to deliver its peak output power, $R_{opt}$ is given by $$R_{opt} = \frac{(V_{dd} - V_k)^2}{2P_{peak}} \quad (1)$$

where $V_{dd}$ is drain voltage bias, $V_k$ is transistor's knee voltage. $P_{peak}$ denotes peak output power. Equation (1) shows that, the larger $P_{peak}$ is, the small is $R_{opt}$.

The output powers also can be combined in series by utilizing transmission lines. Such kind of amplifier is so-called distributed amplifier (DP) as shown in FIG. 3, where the drain parasitic capacitance Cd and the transmission line Ld form an artificial transmission line. The input power is distributed to each transistor through another artificial transmission line, i.e. Lg and Cg sections, at the gate. If the gate and the drain transmission line provide the same phase shifts, the drain currents from multiple transistors are added up constructively at the load $Z_{od}$. Combining by transmission lines is superior to combining by transformers in term of losses, because the losses associated with the second winding and coupling between two windings are avoided.

The distributed amplifier mentioned above has a gain response with a frequency range from DC to a cutoff frequency, i.e. a low pass amplifier. A band-pass distributed amplifier is introduced in N. P. Mehta and P. N. Shastry "*Design guidelines for a novel bandpass distributed amplifier*", European Microwave Conference (EuMC), pp. 1-4, 2005, and H. Rashtian and O. Momeni, "*Gain boosting in distributed amplifiers for close-to-fmax operation in silicon*", IEEE TRANSACTIONS ON MICROWAVE THEORY AND TECHNIQUES, Vol. 67, 2019, which is shown in FIG. 4, where shunted inductors L2 is added at both gate and drain transmission lines. Capacitor Cb is used for dc-decoupling.

However, the uniform distributed amplifier where transmission lines has the same width and length has drawbacks such as: input power for each transistor is unequal, because the transistors in front takes off a portion of power; a portion of output power travels to left and gets dissipated at resistor Zod; transistors are not equally or optimally loaded because the load of the transistor is modulated by the output currents from other transistors.

Therefore, nonuniform distributed power amplifier is proposed to deal with those problems, as shown in FIG. 5, which is disclosed in C. F. Campbell, "*Evolution of the nonuniform distributed power amplifier*", IEEE Microwave Magazine, Vol. 20, No. 1, pp. 18-27, 2019. In a nonuniform DP, resistor Zod is removed, and the drain of the transistor at the most left side is connected with one terminal of the transmission line at the drain. Each transmission line has different width, thus has different characteristic impedance $Z_{o,i}$(i=1, 2 . . . N). The characteristic impedance of the transmission lines at the drain decreases from the left to the right side, to force the most drain currents flowing towards the load. Furthermore, a capacitor $C_{g,i}$(i=1, 2 . . . N) is added at the gate of the transistor. The capacitance of $c_{g,i}$ is reduced from the left to the right side, to equalize the input power for every transistor. The capacitor $c_{g,i}$ can also increase the cut-off frequency.

Recently, in P. Saad et. al., "*A 1.8-3.8-GHz power amplifier with 40% efficiency at 8-dB power back-off*", IEEE TRANSACTIONS ON MICROWAVE THEORY AND TECHNIQUES, VOL. 66, NO. 11, pp. 4870-4882, November 2018, it is proposed a distributed efficient power amplifier (DEPA), as shown in FIG. 6, designing an ultra-wide bandwidth DPA.

There are some problems with the existing power combining solutions, for examples:

A Wilkinson power combiner, especially, a multi-way power combiner, has a relatively large footprint, utilizing quarter wavelength transmission lines. A minimized microstrip power combiner has a large impedance of >50Ω at the power cell port, thus, an extra impedance matching network, e.g. a transformer, is needed to transform the large impedance into transistor's $R_{opt}$;

Limited quality factor makes the transformer based combiner quite lossy at mm-Wave, e.g. transformer's loss is above 1.2 dB.

For the DEPA in FIG. 6, the required optimal admittance $Y_{opt}=1/R_{opt}$ for the auxiliary amplifiers should be equal to the admittance difference between the neighboring transmission line sections. If $R_{opt}$ is too small, the required admittance difference would be difficult to realize in a real implementation.

SUMMARY

Therefore, an object of embodiments herein is to provide a power amplifier with an improved power combination.

According to an aspect, the object is achieved by a power amplifier. The power amplifier comprises a number n of power cells $A_i$, where i=1, . . . n, each power cell has an input terminal and an output terminal.

The power amplifier further comprises a number n of output transmission lines $TL_{1i}$ for combining output powers from the power cells, where i=1, . . . n. Each output transmission line has a first terminal and a second terminal, the second terminal of the i-th transmission line is connected to the first terminal of the (i+1)-th transmission line such that the number n of output transmission lines are connected in series.

The power amplifier further comprises a number n of impedance transformation network ($ITN_i$), where i=1, . . . n, each impedance transformation network has an input terminal and output terminal.

The output terminal of i-th power cell is connected to the input terminal of the i-th impedance transformation network and the output terminal of the i-th impedance transformation network is connected to the first terminal of the i-th output transmission line.

Each impedance transformation network is an upward impedance transformation network for transforming an output impedance of each power cell at the input terminal of the impedance transformation network into a higher impedance at the output terminal of the impedance transformation network.

The proposed power amplifier according to embodiments herein combines the output powers of the multiple power cells, e.g. common source configured transistors through transmission lines connected in series. The transistors' drain is connected with the transmission line via an impedance transformation network, which may be a tapped capacitor or tapped inductor impedance transformation network.

This tapped capacitor or inductor impedance transformation network transfers impedance upward, and releases loading from the transistors to the transmission lines. Therefore, it provides impedance matching for large transistor with a small $R_{opt}$ and enables the transistor to deliver a large output power.

The proposed power amplifier according to embodiments herein has some advantages:

Output powers of the transistors are combined by a series-combining through transmission lines, which provides a relative low impedance for each power cell, comparing with parallel-combining transformers or a Wilkinson power combiner.

The transmission lines in the proposed power amplifier may be nonuniform and power combining by using the nonuniform transmission lines has a lower loss and a smaller footprint than series-combining transformers.

By adding upward impedance transformation networks at a nonuniform distributed amplifier, it is possible to match a small $R_{opt}$ of a large transistor to get a large output power.

Tapped capacitor or inductor impedance transformation network may utilize only two passive components, and thus has a small footprint.

The transistor's parasitic capacitance may be a part of tapped capacitor impedance transformation network.

Therefore the power amplifier according to embodiments herein provides improved power combiner and can achieve a large output power.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

Figure 1:
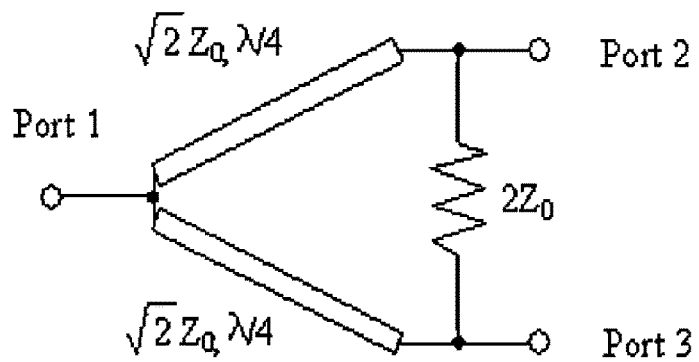
FIG. 1 is a schematic block diagram illustrating a 2-way Wilkinson power combiner.
Figure 2:
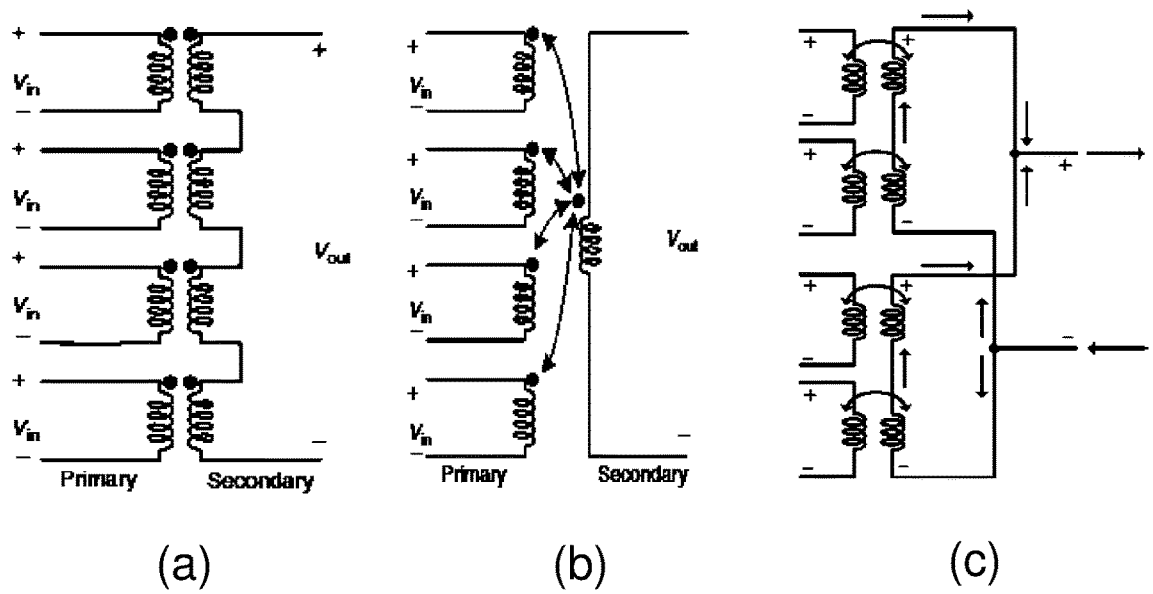
FIGS. 2 (a)-(c) are schematic block diagrams illustrating power combining by transformers.
Figure 3:
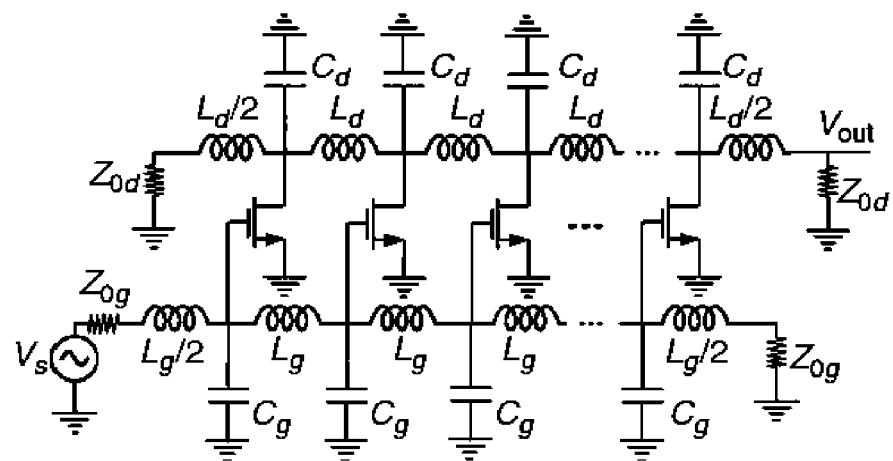
FIG. 3 is a schematic block diagram illustrating an equivalent circuit of a distributed amplifier based on lumped-element artificial transmission lines.
Figure 4:
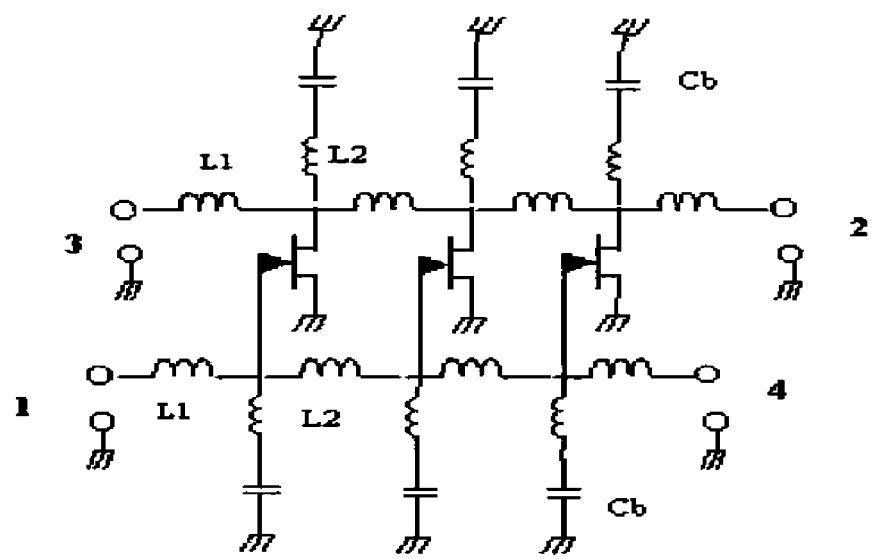
FIG. 4 is a schematic block diagram illustrating a bandpass distributed amplifier.
Figure 5:
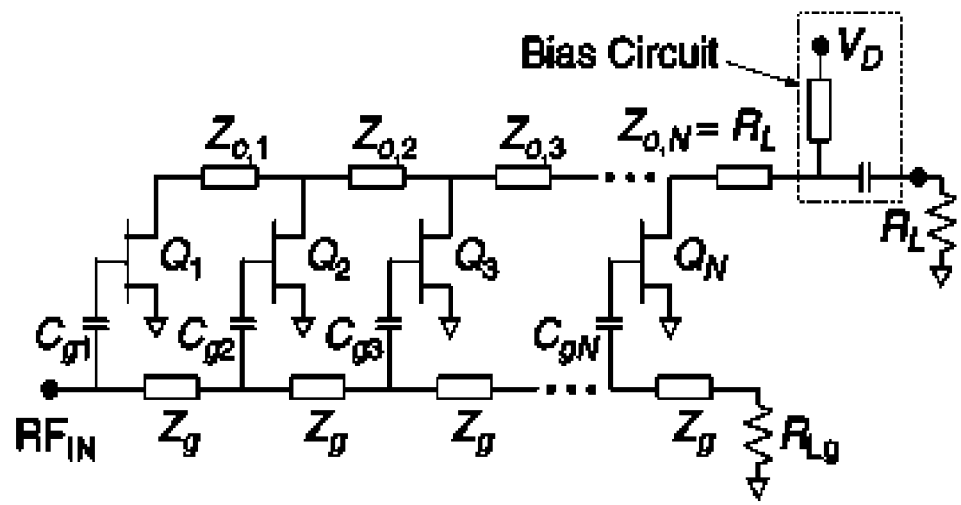
FIG. 5 is a schematic block diagram illustrating a nonuniform distributed power amplifier.
Figure 6:
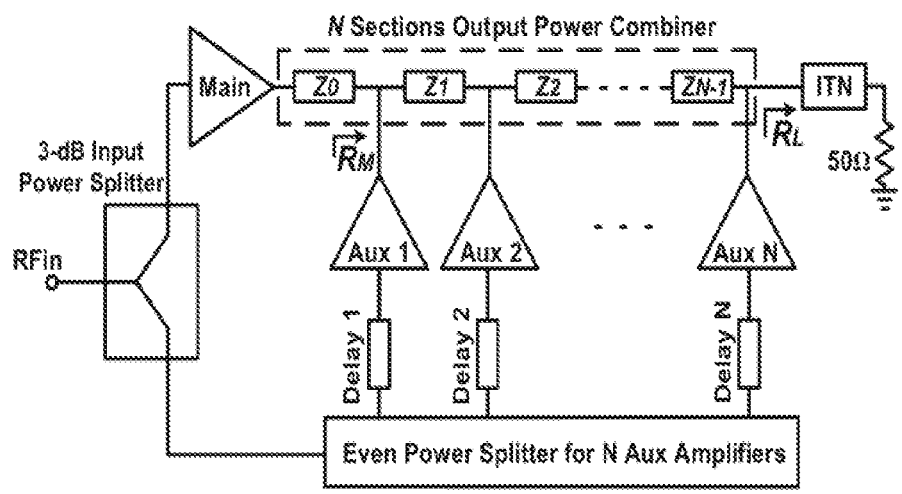
FIG. 6 is a schematic block diagram illustrating a distributed efficient power amplifier (DEPA) architecture.

Throughout the following description similar reference numerals have been used to denote similar features, such as elements, units, modules, circuits, nodes, parts, items or the like, when applicable.

Figure 7:
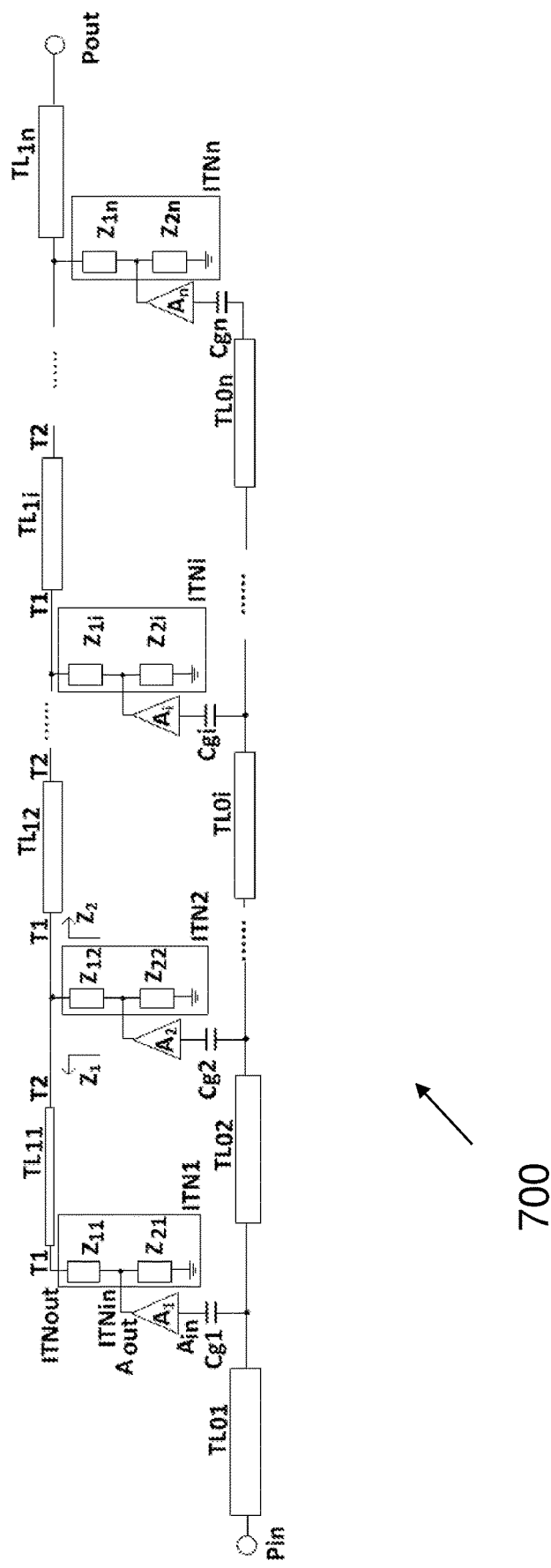
FIG. 7 is a schematic block diagram illustrating power amplifier according to embodiments herein.

FIG. 7 shows a schematic of a proposed power amplifier 700 with upward impedance transformation networks according to embodiments herein.

The power amplifier 700 comprises a number n of power cells Ai, where i=1, . . . n. Each power cell has an input terminal Ain and an output terminal Aout.

The power amplifier 700 further comprises a number n of output transmission lines $TL_{1i}$ for combining output powers from the power cells, where i=1, . . . n. Each output transmission line has a first terminal T1 and a second terminal T2. The second terminal of the i-th transmission line $TL_{1i}$ is connected to the first terminal of the (i+1)-th transmission line $TL_{1(i+1)}$ such that the number n of output transmission lines are connected in series. For example, the second terminal T2 of the first transmission line $TL_{11}$ is connected to the first terminal T1 of the second transmission line $TL_{12}$.

The power amplifier 700 further comprises a number n of impedance transformation network $ITN_i$, where i=1, . . . n. Each impedance transformation network has an input terminal ITNin and an output terminal INTout. The output terminal Aout of i-th power cell is connected to the input terminal ITNin of the i-th impedance transformation network and the output terminal ITNout of the i-th impedance transformation network is connected to the first terminal T1 of the i-th output transmission line. For example, the output terminal of the second power cell $A_2$ is connected to the input terminal of the second impedance transformation network and the output terminal of the second impedance transformation network is connected to the first terminal of the second output transmission line $TL_{12}$.

Each impedance transformation network is an upward impedance transformation network for transforming an output impedance of each power cell at the input terminal of the impedance transformation network into a higher impedance at the output terminal of the impedance transformation network.

Each of the output transmission lines may have the same width and length or may have different widths and lengths.

The power amplifier may further comprise a number n of input transmission lines $TL_{0i}$ connected in series. Each input transmission line has a first terminal and a second terminal, where the second terminal of the i-th input transmission line is connected to the first terminal of the (i+1)-th input transmission line, and wherein the input terminal of the i-th power cell is connected to the second terminal of the i-th transmission line via a capacitor, where i=1, . . . n. An input port Pin of the whole PA is connected with the first terminal of the first transmission line $TL_{01}$.

Figure 8:
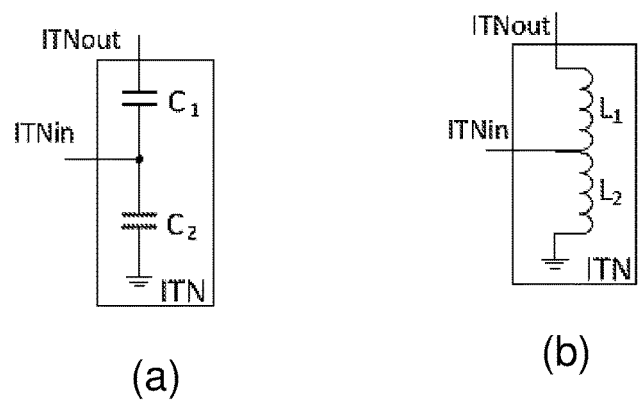
FIGS. 8 (a) and (b) are schematic block diagrams illustrating examples of impedance transformation network (ITN) according to embodiments herein.

Each impedance transformation network INT may be a tapped capacitor impedance transformation network or a tapped inductor impedance transformation network, as shown in FIGS. 8 (a) and (b). As shown in FIG. 8 (a), the tapped capacitor impedance transformation network may comprise a first and second capacitors $C_1$, $C_2$ connected in series, where a second terminal of the first capacitor is connected to a first terminal of the second capacitor to form a tapped node. The input terminal of the impedance transformation network INTin is connected to the tapped node, the output terminal of the impedance transformation network INTout is connected to a first terminal of the first capacitor $C_1$, a second terminal of the second capacitor $C_2$ is connected to a ground.

As shown in FIG. 8 (b), the tapped inductor impedance transformation network may comprise a first and second inductors $L_1$, $L_2$ connected in series. A second terminal of the first inductor $L_1$ is connected to a first terminal of the second inductor $L_2$ to form a tapped node. The input terminal INTin of the impedance transformation network is connected to the tapped node, the output terminal INTout of the impedance transformation network is connected to a first terminal of the first inductor $L_1$, a second terminal of the second inductor $L_2$ is connected to a ground.

In the following, the principle and performance of the proposed power amplifier 700 will be analysed.

Each power cell may be a common source configured transistor. Each transistor connected with the junction of two transmission lines $TL_{1i}$ should be matched to $R'_{opt}$, where $R'_{opt}$ is the output impedance of the ITN with the input impedance of $R_{opt}$. The inverse of $R'_{opt}$, i.e. $1/R'_{opt}$, needs to be matched to the admittance difference:

$$\frac{1}{R'_{opt}} = \frac{1}{Z_i} - \frac{1}{Z_{i+1}} (i = 1, 2 \ldots n) \qquad (2)$$

where $Z_i$ is the impedance looking to left from the junction of two transmission lines, $Z_{i+1}$ is the impedance looking to the right from the junction of the two transmission lines, as shown $Z_1$, $Z_2$ in FIG. 7. The impedance $Z_i$ depends on the TL's length and width, as well as the loading of the neighboring transistors at either left side or right side. The larger $R'_{opt}$ is, the easier it is for impedance matching. Unfortunately, to deliver a large output power, a large transistor has a small $R_{opt}$. Furthermore, a large transistor has a large parasitic capacitance which loads on transmission lines at drain. Those parasitic capacitors, together with the transmission lines, will form artificial transmission lines.

An upward impedance transformation network transfers the small $R_{opt}$ and a large parasitic capacitance into a large $R'_{opt}$ and a small capacitance, i.e. high impedance. The transistor's parasitic capacitance may be part of upward impedance transformation network.

Figure 9:
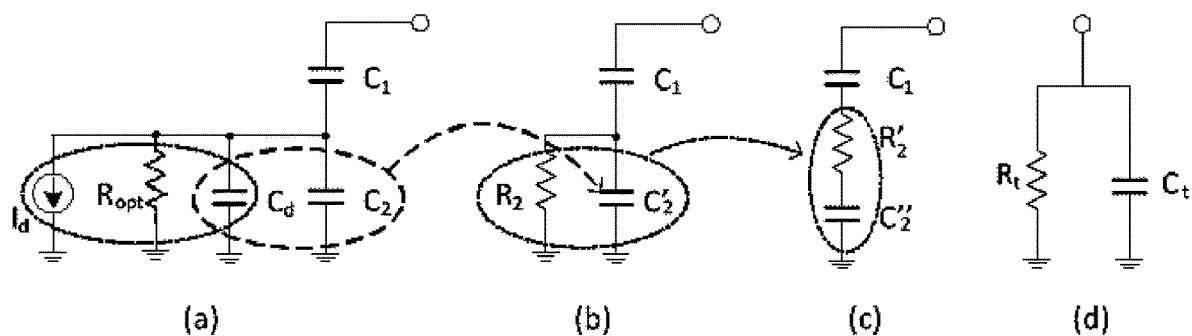
FIGS. 9 (a)-(d) are equivalent circuits of a transistor with a tapped capacitor impedance transformation network.

A tapped capacitor impedance transformation network connected to a transistor is shown in FIG. 9. The transistor is represented by a Norton-equivalent circuit, i.e., a current source, $I_d$, with a shunted parasitic capacitor, $C_d$. While, $R_{opt}$ is the impedance should be provided by the tapped capacitor impedance transformation network, as shown in FIG. 9 (a). $C_1$ and $C_2$ represent two capacitors in the tapped capacitor impedance transformation network.

FIG. 9 (b) shows the equivalent circuit after merging $C_2$ and $C_d$, where $R_2 = R_{opt}$, $C'_2 = C_d + C_2$. The parasitic capacitance, $C_d$, becomes a part of the tapped capacitor impedance transformation network, $C'_2 = C_d + C_2$, and $R_2$ is equal to $R_{opt}$.

FIG. 9 (c) shows the equivalent circuit after transferring parallel connected resistor $R_2$ and capacitors ($C_2 + C_d$) into series.

FIG. 9 (d) shows the equivalent circuit after transferring series connected capacitors and resistor into parallel.

To get the equivalent $R_t$ and C connected in parallel of the tapped capacitor matching network, as shown in FIG. 9 (d), the parallel connected capacitor $C'_2$ and resistor $R_2$, as shown in FIG. 9 (b) are replaced by $R'_2$ and $C''_2$ connected in series, as shown in FIG. 9 (c), and $$R'_2 = \frac{R_2}{1+Q_2^2} \qquad (3a)$$

$$C''_2 = (C_d + C_2)\left(1 + \frac{1}{Q_2^2}\right) \qquad (3b)$$

where $Q_2$ is the Q-factor of the parallel connected $R_2$ and $C'_2$:

$$Q_2 = \omega_0(C_d + C_2)R_2.$$

The equivalent capacitance, $C_{eq}$, represents the total capacitance of $C_1$ and $C'_2$ in series, which is given by $$C_{eq} = \frac{C_1(C_d + C_2)\left(1 + \frac{1}{Q_2^2}\right)}{C_1 + (C_d + C_2)\left(1 + \frac{1}{Q_2^2}\right)} \quad (4)$$

$$\text{If } Q_2^2 \gg 1, C_{eq} \approx \frac{C_1(C_d + C_2)}{C_1 + C_d + C_2}.$$

Furthermore, the Q-factor of the series connected $R'_2$ and $C_{eq}$ is defined as $$Q = \frac{1}{\omega_0 C_{eq} R'_2} = \frac{C_1 Q_2^2 + (C_d + C_2)(1 + Q_2^2)}{Q_2 C_1} \quad (5)$$

$$\text{If } Q_2^2 \gg 1, Q \approx Q_2\left(1 + \frac{C_d + C_2}{C_1}\right).$$

Finally, the equivalent $R_t$ and $C_t$ connected in parallel are given by $$R_t = R'_2(1 + Q^2) \quad (6a)$$

$$C_t = \frac{C_{eq}}{1 + \frac{1}{Q^2}} \quad (6b)$$

If $Q_2^2 \gg 1$ and $Q^2 \gg 1$, $$R_t \approx R_{opt}\left[1 + \frac{C_d + C_2}{C_1}\right]^2 \quad (7a)$$

$$C_t \approx \frac{C_1(C_d + C_2)}{C_1 + C_d + C_2} \quad (7b)$$

From equations (3)-(7), it can be found that, using the tapped capacitor matching network, the resistance is increased approximately by a factor of $$\left[1 + \frac{C_d + C_2}{C_1}\right]^2,$$

and the capacitance is reduced approximately by a factor of $$\left[\frac{C_1\left(1 + \frac{C_2}{C_d}\right)}{C_1 + C_2 + C_d}\right].$$

Note that $R_t$ represents $R'_{opt}$ in (2).

It should be pointed out that the tapped capacitor impedance transformation network is just one example embodiment. Other type of upward impedance matching network may be used also. For example, two capacitors may be replaced by two inductors, forming a tapped inductor impedance transformation network. Moreover, an π or T network, may be used too. However, the π or T network is comprised of, at least, 3 passive components, which has a larger footprint than that of a tapped capacitor and inductor impedance transformation network.

Therefore, according to some embodiments, each upward impedance transformation network may comprise a T-impedance matching network comprising at least three passive components connected in T-shape.

According to some embodiments, each impedance transformation network may comprise a π-impedance matching network comprising at least three passive components connected in π-shape.

According to some embodiments, each impedance transformation network may comprise a transformer.

According to some embodiments, each power cell may comprise a common-source configured transistor, a gate of each transistor is connected to the input terminal of the power cell and a drain of each transistor is connected to the output terminal of the power cell, a source of each transistor is connected to a ground.

Figure 10:
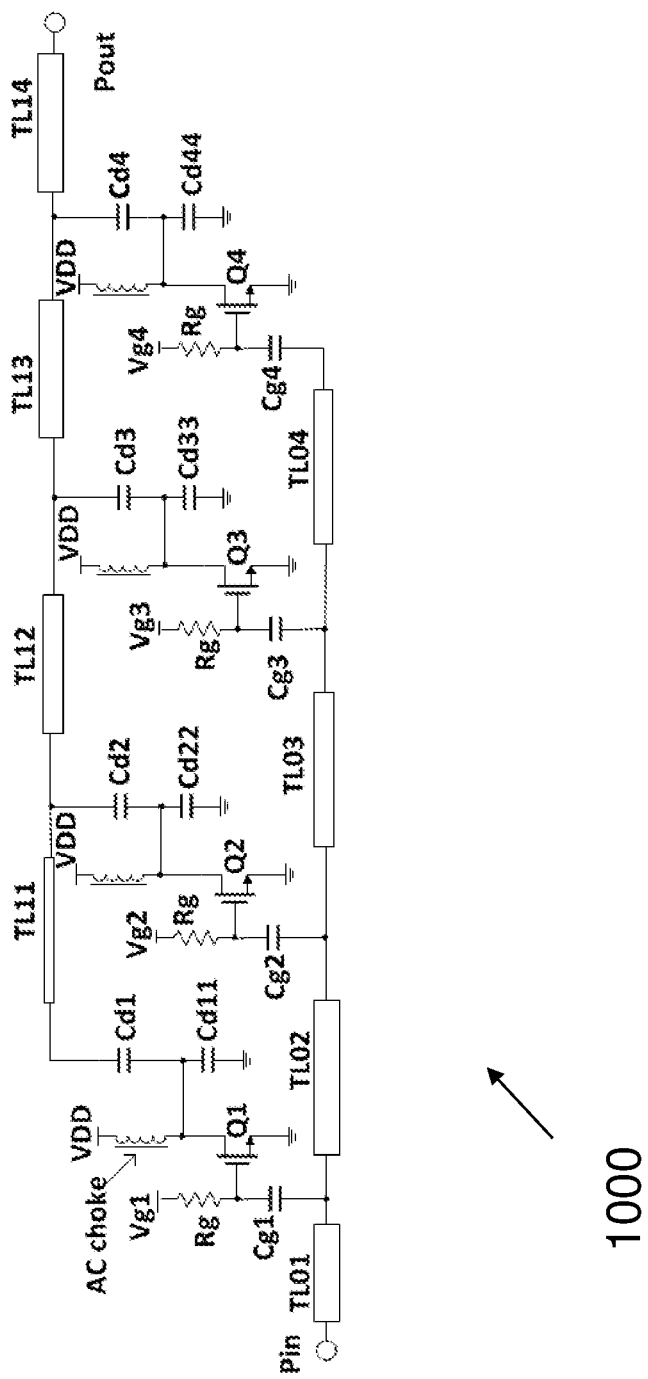
FIG. 10 is a schematic block diagram illustrating one example power amplifier according to embodiments herein.

FIG. 10 shows an example embodiment of a 70-88 GHz PA 1000 targeting a large output power. This PA has 4 common-source configured transistors. Each drain of the transistor is connected with a tapped capacitor matching network consisting of $C_{di}$ and $C_{dii}$ (i=1, 2, 3, 4). Each tapped capacitor impedance transformation network is connected with the junction of the output transmission lines, $TL_{1i}$ (i=1, 2, 3, 4), except the first one which is connected with a first terminal of $TL_{11}$. The width of the TLs increases from the left side to the right side. Therefore, the characteristic impedance of the TLs decreases correspondingly. The drain bias is provided through an AC choke. Each gate of the transistor is connected with the junction of the input transmission lines $TL_{0i}$ (i=1, 2, 3, 4) via a capacitor $C_{gi}$ (i=1, 2, 3, 4), except the last capacitor $C_{g4}$ is connected with a second terminal of $TL_{O4}$. Capacitance of $C_{gi}$ increases from the left side to the right side, to keep the input signal for all transistors having the same amplitude. The gate resistor $R_g$ is inserted between the transistor's gate and the gate bias, to block the leakage of the RF signal. The input port is connected with the first terminal of the first transmission line $TL_{O1}$.

Figure 11:
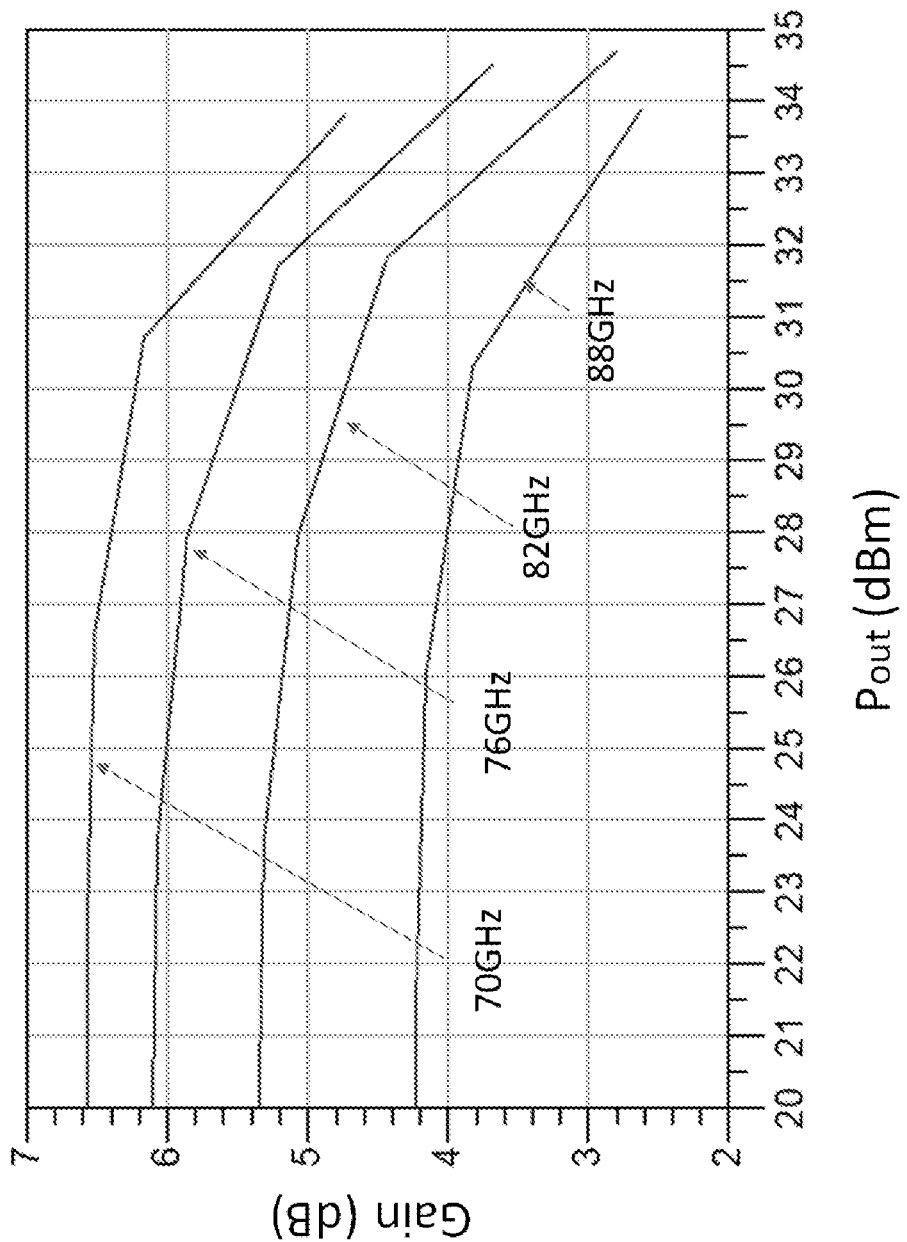
FIG. 11 is a diagram showing gain of the PA according to embodiments herein.

FIG. 11 shows PA's gain versus output power at frequencies 70 GHz, 76 GHz, 82 GHz, as well as 88 GHz. The small signal gain of the PA 1000 is varied between 4.2 dB to 6.6 dB at different frequencies. As output power increases, the gain decreases no more than 2.5 dB for those frequencies. The maximum output power of the PA varies between 33.8 dBm and 34.7 dBm for different frequencies.

Figure 12:
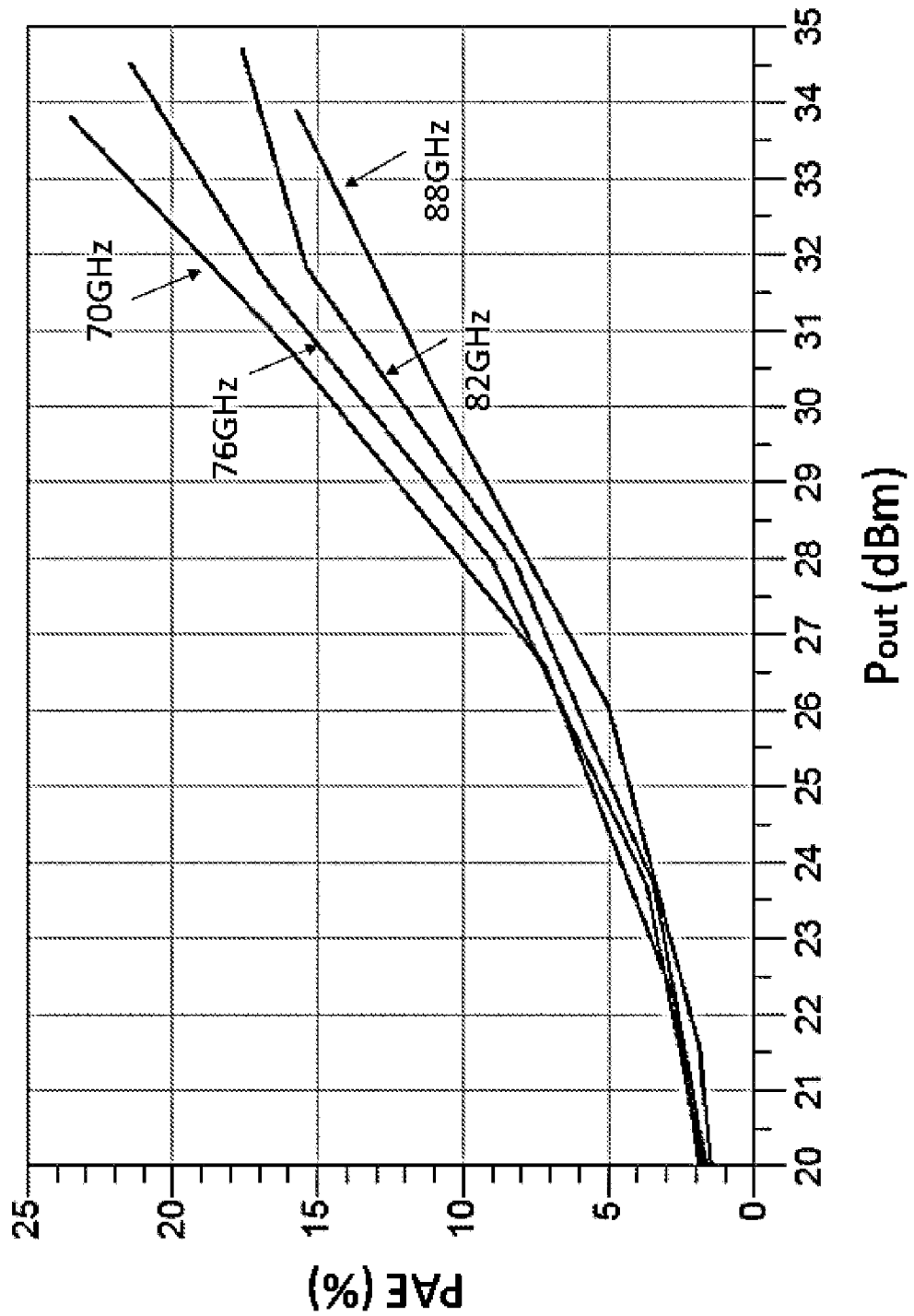
FIG. 12 is a diagram showing efficiency of the PA according to embodiments herein.

FIG. 12 shows power added efficiency (PAEs) of the PA 1000 at frequencies 70 GHz, 76 GHz, 82 GHz, as well as 88 GHz. The maximum PAEs varies between 16% to 24% at different frequencies.

In summary, the PA 700, 1000 according to embodiments herein combines the output powers of the multiple power cells or transistors $A_i$ (i=1, 2 . . . n), through transmission lines $TL_{1i}$ (i=1, 2 . . . n), connected in series. These transmission lines may have different widths and lengths. The transistor's drain is connected with the transmission lines via an impedance transformation network. This impedance transformation network may be a tapped capacitor or inductor network which transfers impedance upward, i.e.

transfers a low impedance at the input terminal of the impedance transformation network connecting with the drain into a large impedance at the output terminal of the impedance transformation network. The output terminal of the impedance transformation network is connected with the transmission lines, and releases loading from the transistors to the transmission lines $TL_{1i}$. Therefore, it provides impedance matching for large transistors with a small $R_{opt}$, to increase output power.

The input power is distributed though transmission lines $TL_{0i}$ (i=1, 2 ... n) connected in series, as well as the capacitors at the gates, $C_{gi}$ (i=1, 2 ... n). These capacitors may have different capacitances and help to equalize the input power for each transistor.

Figure 13:
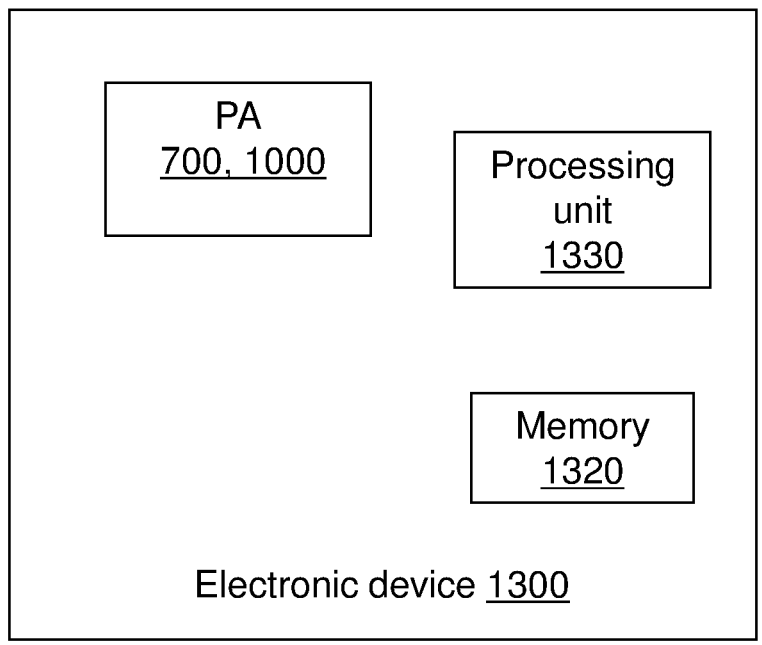
FIG. 13 is a block diagram showing an electronic device in which the power amplifier according to embodiments herein may be implemented.

The power amplifier 700, 1000 according to embodiments herein may be employed in various electronic devices. FIG. 13 shows a block diagram for an electronic device 1300, which may be, e.g. a radio frequency transceiver, a transmitter, a wireless communication device, a user equipment, a mobile device, a base station or a radio network node etc. in a wireless communication systems, or any general electronic circuit or equipment which needs a power amplifier. The electronic device 1300 may comprise other units, where a processing unit 1310, a memory 1320 are shown.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the invention, which is defined by the appending claims.

The invention claimed is:

1. A power amplifier comprising:
   a number n of power cells $A_i$, where i=1, ... n, each power cell has an input terminal and an output terminal;
   a number n of output transmission lines TL1i for combining output powers from the power cells, where i=1, ... n, each output transmission line having a first terminal and a second terminal, the second terminal of the i-th transmission line is connected to the first terminal of the (i+1)-th transmission line such that the number n of output transmission lines are connected in series; and
   a number n of impedance transformation network $ITN_i$, where i=1, ... n, each impedance transformation network has an input terminal and output terminal;
   the output terminal of i-th power cell is connected to the input terminal of the i-th impedance transformation network and the output terminal of the i-th impedance transformation network is connected to the first terminal of the i-th output transmission line; and
   each impedance transformation network is an upward impedance transformation network for transforming an output impedance of each power cell at the input terminal of the impedance transformation network into a higher impedance at the output terminal of the impedance transformation network.

2. The power amplifier according to claim 1, wherein each power cell comprises a common-source configured transistor, and wherein a gate of each transistor is connected to the input terminal of the power cell and a drain of each transistor is connected to the output terminal of the power cell, a source of each transistor is connected to a ground.

3. The power amplifier according to any one of claim 1, wherein each impedance transformation network is a tapped capacitor impedance transformation network comprising a first and second capacitors connected in series, where a second terminal of the first capacitor is connected to a first terminal of the second capacitor to form a tapped node, and wherein the input terminal of the impedance transformation network is connected to the tapped node, the output terminal of the impedance transformation network is connected to a first terminal of the first capacitor, a second terminal of the second capacitor is connected to a ground.

4. The power amplifier according to claim 3, wherein parasitic capacitance of a transistor in each power cell is a part of the tapped capacitor impedance transformation network.

5. The power amplifier according to claim 1, wherein each impedance transformation network is a tapped inductor impedance transformation network comprising a first and second inductors connected in series, where a second terminal of the first inductor is connected to a first terminal of the second inductor to form a tapped node, and wherein the input terminal of the impedance transformation network is connected to the tapped node, the output terminal of the impedance transformation network is connected to a first terminal of the first inductor, a second terminal of the second inductor is connected to a ground.

6. The power amplifier according to claim 1, wherein each impedance transformation network comprises a T-impedance matching network comprising at least three passive components connected in T-shape.

7. The power amplifier according to claim 1, wherein each impedance transformation network comprises a π-impedance matching network comprising at least three passive components connected in π-shape.

8. The power amplifier according to claim 1, wherein each impedance transformation network comprises a transformer.

9. The power amplifier according to claim 1, wherein the output transmission lines have different widths and lengths.

10. The power amplifier according to claim 1, wherein each of the output transmission lines has the same width and length.

11. The power amplifier according to claim 1, further comprising a number n of input transmission lines $TL_{oi}$ (i=1,2...n) connected in series, each input transmission line has a first terminal and a second terminal, where the second terminal of the i-th transmission line is connected to the first terminal of the (i+1)-th transmission line, and the input terminal of the i-th power cell is connected to the second terminal of the i-th transmission line via a capacitor, where i=1, ... n. and an input port of the whole PA is connected with the first terminal of the first transmission line.

12. An electronic device comprising a power amplifier, the power amplifier comprising:
   a number n of power cells $A_i$, where i=1, ... n, each power cell has an input terminal and an output terminal;
   a number n of output transmission lines $TL_{1i}$ for combining output powers from the power cells, where i=1 ... n, each output transmission line having a first terminal and a second terminal, the second terminal of the i-th transmission line is connected to the first terminal of the (i+1)-th transmission line such that the number n of output transmission lines are connected in series; and
   a number n of impedance transformation network $ITN_i$, where i=1 ... n, each impedance transformation network has an input terminal and output terminal;
   the output terminal of i-th power cell is connected to the input terminal of the i-th impedance transformation network and the output terminal of the i-th impedance transformation network is connected to the first terminal of the i-th output transmission line; and each impedance transformation network is an upward impedance transformation network for transforming an output impedance of each power cell at the input terminal of the impedance transformation network into a higher impedance at the output terminal of the impedance transformation network.

13. The electronic device according to claim 12, wherein the electronic device is one of a transmitter, a transceiver, a base station, a mobile device, and a user equipment in a wireless communication system.

14. The electronic device according to claim 12, wherein each power cell comprises a common-source configured transistor, and wherein a gate of each transistor is connected to the input terminal of the power cell and a drain of each transistor is connected to the output terminal of the power cell, a source of each transistor is connected to a ground.

15. The electronic device according to claim 12, wherein each impedance transformation network is a tapped capacitor impedance transformation network comprising a first and second capacitors connected in series, where a second terminal of the first capacitor is connected to a first terminal of the second capacitor to form a tapped node, and wherein the input terminal of the impedance transformation network is connected to the tapped node, the output terminal of the impedance transformation network is connected to a first terminal of the first capacitor, a second terminal of the second capacitor is connected to a ground.

16. The electronic device according to claim 15, wherein parasitic capacitance of a transistor in each power cell is a part of the tapped capacitor impedance transformation network.

17. The electronic device according to claim 12, wherein each impedance transformation network is a tapped inductor impedance transformation network comprising a first and second inductors connected in series, where a second terminal of the first inductor is connected to a first terminal of the second inductor to form a tapped node, and wherein the input terminal of the impedance transformation network is connected to the tapped node, the output terminal of the impedance transformation network is connected to a first terminal of the first inductor, a second terminal of the second inductor is connected to a ground.

18. The electronic device according to claim 12, wherein each impedance transformation network comprises a T-impedance matching network comprising at least three passive components connected in T-shape.

19. The electronic device according to claim 12, wherein each impedance transformation network comprises a $\pi$-impedance matching network comprising at least three passive components connected in $\pi$-shape.

20. The electronic device according to claim 12, wherein each impedance transformation network comprises a transformer.

* * * * *